United States Patent
Chen et al.

(10) Patent No.: US 8,611,059 B2
(45) Date of Patent: Dec. 17, 2013

(54) POWER MANAGEMENT CIRCUIT AND HIGH VOLTAGE DEVICE THEREIN

(75) Inventors: Che-Hung Chen, Taipei (TW); Yu-Ti Su, Tainan (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 13/410,280

(22) Filed: Mar. 1, 2012

(65) Prior Publication Data

US 2012/0275072 A1    Nov. 1, 2012

(30) Foreign Application Priority Data

Apr. 27, 2011    (TW) .............. 100114704 A

(51) Int. Cl.
*H02H 9/00* (2006.01)
*H02H 7/12* (2006.01)
*H02H 1/00* (2006.01)
*H02H 1/04* (2006.01)
*H02H 3/22* (2006.01)

(52) U.S. Cl.
USPC ........................... 361/56; 361/118

(58) Field of Classification Search
USPC .................. 361/56, 118
See application file for complete search history.

(56) References Cited

U.S. PATENT DOCUMENTS

| | | | |
|---|---|---|---|
| 6,358,781 B1 | 3/2002 | Lee et al. | |
| 6,542,346 B1 | 4/2003 | Chen et al. | |
| 6,724,592 B1* | 4/2004 | Tong et al. | 361/56 |
| 7,978,450 B1* | 7/2011 | Perisetty | 361/56 |
| 2008/0013231 A1 | 1/2008 | Bazzano et al. | |
| 2008/0128818 A1 | 6/2008 | Chen et al. | |
| 2011/0051298 A1* | 3/2011 | Lai | 361/56 |

OTHER PUBLICATIONS

Kwang-Hoon Oh, "Investigation of ESD performance in advanced CMOS technology" PhD thesis, University of Stanford, 2002.
Physics and operation of ESD Protection Circuit Elements.

* cited by examiner

*Primary Examiner* — Dharti Patel
(74) *Attorney, Agent, or Firm* — CKC & Partners Co., Ltd.

(57) ABSTRACT

A high voltage device includes a high voltage transistor and a protection device. The high voltage transistor has a first end and a second end, in which the first end is coupled to a voltage input/output terminal. The protection device is coupled between the second end of the high voltage transistor and a ground terminal, and has a parasitical equivalent circuit. When the voltage input/output terminal is charged based on positive ESD charges, the current corresponding to the positive ESD charges flows from the voltage input/output terminal through the high voltage transistor and the equivalent circuit in the protection device toward the ground terminal. A power management circuit is also disclosed herein.

19 Claims, 10 Drawing Sheets

US 8,611,059 B2

POWER MANAGEMENT CIRCUIT AND HIGH VOLTAGE DEVICE THEREIN

RELATED APPLICATIONS

This application claims priority to Taiwan Patent Application Serial Number 100114704, filed Apr. 27, 2011, which is herein incorporated by reference.

BACKGROUND

1. Technical Field

The present disclosure relates to an electronic device. More particularly, the present disclosure relates to an electrostatic discharge (ESD) protection circuit.

2. Description of Related Art

Conventionally, there is an electrostatic discharge (ESD) protection mechanism set in every kind of electronic apparatus, so as to prevent the electronic apparatus from being damaged due to a momentary large current when a human body carrying too many electrostatic discharge charges touches the electronic apparatus, or to prevent the electronic apparatus from being affected by electrostatic discharge charges existing in the environment or carried by transportation and thus abnormally operating.

For the electronic apparatus operated with a high voltage condition, a high voltage device usually can be applied therein so as to provide capability of processing high voltages. Under the condition that the electronic apparatus is not operated, the high voltage device itself also can sustain the ESD current without being damaged.

However, the high voltage device mentioned above cannot provide effective ESD protection. Thus, when the electrostatic discharge happens such that the large current is momentarily generated, the foregoing high voltage device still cannot effectively prevent the electronic apparatus from being damaged by the electrostatic discharge, and the large current momentarily generated due to the electrostatic discharge may still flow through the high voltage device to other internal circuits so that devices in the other internal circuits are damaged.

SUMMARY

The embodiments of the present disclosure provide an electrostatic discharge (ESD) protection circuit so as to perform ESD protection.

An aspect of the present invention is related to a high voltage device, which comprises a high voltage transistor and a protection device. The high voltage transistor has a first end and a second end, in which the first end is coupled to a voltage input/output terminal. The protection device is coupled between the second end of the high voltage transistor and a ground terminal, and the protection device has a parasitical equivalent circuit. When the voltage input/output terminal is charged according to positive electrostatic discharge charges, a current corresponding to the positive electrostatic discharge charges flows from the voltage input/output terminal through the high voltage transistor and the equivalent circuit in the protection device toward the ground terminal.

Another aspect of the present invention is related to a high voltage device, which comprises a high voltage transistor and a protection device. The high voltage transistor comprises a first electrode and a second electrode. The protection device comprises a third electrode and a fourth electrode, and the second electrode of the high voltage transistor and the third electrode of the protection device at least share a first heavily doped layer.

Yet another aspect of the present invention is related to a power management circuit, which comprises a high voltage device. The high voltage device comprises a high voltage transistor and a transistor. The high voltage transistor is coupled to a voltage input/output terminal and comprises an N-type buffer layer and a first N-type heavily doped layer, in which the first N-type heavily doped layer being formed in the N-type buffer layer. The transistor is coupled to a ground terminal and integrated with the high voltage transistor, and the transistor comprises the N-type buffer layer and the first N-type heavily doped layer. When the voltage input/output terminal is charged according to positive electrostatic discharge charges, the high voltage device discharges the positive electrostatic discharge charges, such that a current corresponding to the positive electrostatic discharge charges flows from the voltage input/output terminal through the high voltage device toward the ground terminal.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE EMBODIMENTS

In the following description, several specific details are presented to provide a thorough understanding of the embodiments of the present invention. One skilled in the relevant art will recognize, however, that the present invention can be practiced without one or more of the specific details, or in combination with or with other components, etc. In other instances, well-known implementations or operations are not shown or described in detail to avoid obscuring aspects of various embodiments of the present invention.

The terms used in this specification generally have their ordinary meanings in the art and in the specific context where each term is used. The use of examples anywhere in this specification, including examples of any terms discussed herein, is illustrative only, and in no way limits the scope and meaning of the invention or of any exemplified term. Likewise, the present invention is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present invention. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
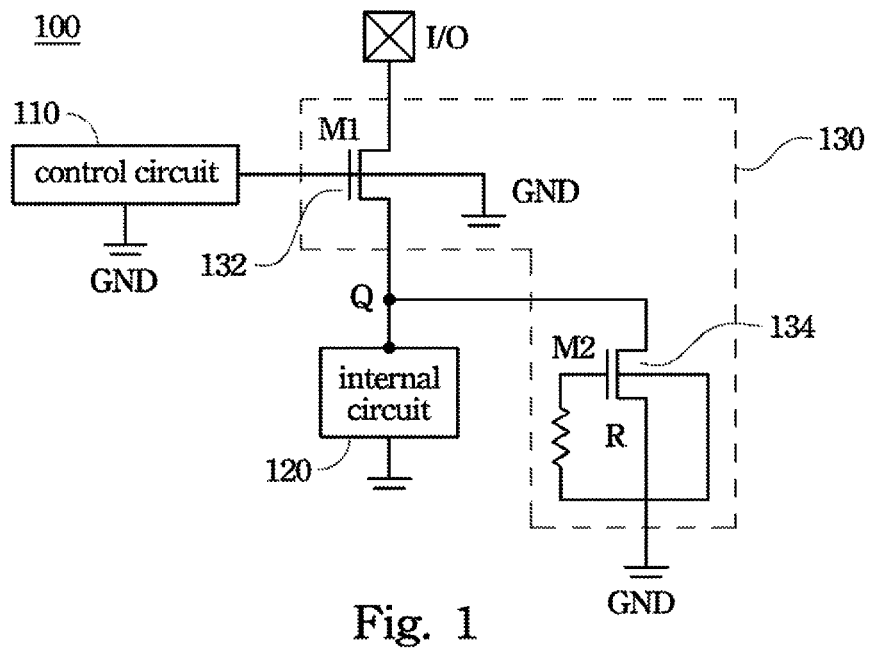
FIG. 1 is a diagram of a power management circuit according to one embodiment of the present invention.

FIG. 1 is a diagram of a power management circuit according to one embodiment of the present invention. The power management circuit 100 includes a control circuit 110, an internal circuit 120 and a high voltage device 130, in which the high voltage device 130 further includes a high voltage transistor 132 and a protection device 134. In practice, the protection device 134 can be integrated with the high voltage transistor 132, and the high voltage transistor 132 can be a metal-oxide-semiconductor field effect transistor (MOSFET) M1. Conventionally, the high voltage transistor 132 is referred to as a device which can be operated with a voltage higher than 3V or 5V. More specifically, the high voltage device or the high voltage transistor in the embodiments of the present invention can be operated under the condition of, for example, 10 volts, several tens of volts, several hundreds of volts or even thousand(s) of volts.

In practice, the power management circuit 100 can be voltage converter circuit, e.g. low drop out (LDO) regulator, which can be applied in the apparatus requiring voltage transformation, such as a power supply, a DC/DC converter or a power amplifier. The power management circuit 100 also can be fabricated with a form of integrated circuit (IC) in a single chip or integrated with other circuits.

In operation, the high voltage transistor 132 can provide capability of converting voltages, in which the high voltage transistor 132 can be controlled by the control circuit 110 and can receive an external high voltage from a voltage input/output terminal I/O, so as to generate an operation voltage with a relatively lower voltage level at one end of the high voltage transistor 132, i.e. node Q, such that the internal circuit 120 can perform operation according to the operation voltage.

Figure 2:
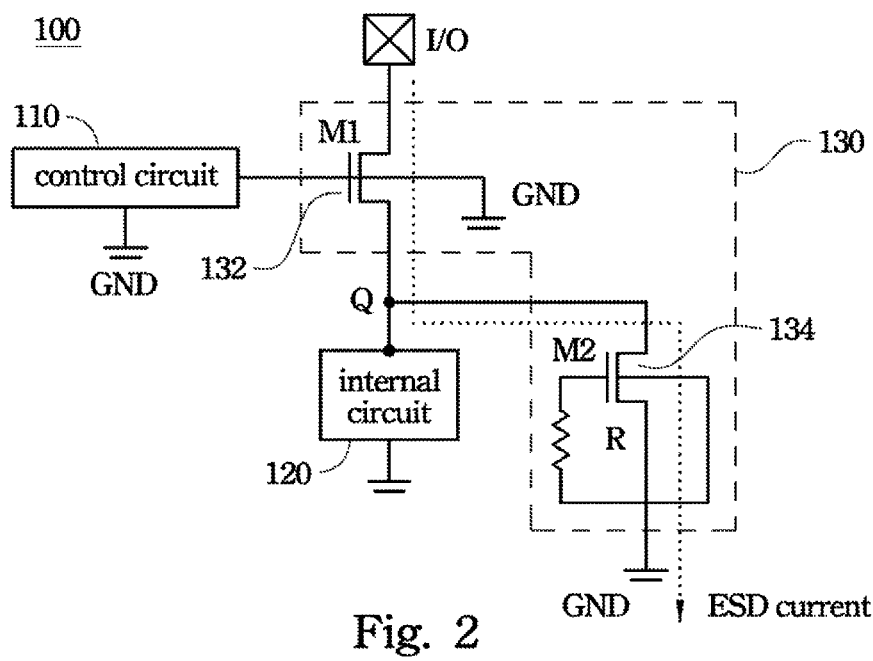
FIG. 2 is a diagram of ESD protection operation of the power management circuit shown in FIG. 1.

The high voltage device 130 is coupled between the voltage input/output terminal I/O and a ground terminal GND. When the power management circuit 100 is not operated and the voltage input/output terminal I/O is charged according to electrostatic discharge charges (hereinafter referred to as ESD charges), the high voltage device 130 can discharge the ESD charges, such that a current corresponding to the ESD charges (e.g., positive ESD charges) flows from the voltage input/output terminal I/O through the high voltage device 130 toward the ground terminal GND, as shown in FIG. 2.

Specifically, as illustrated in FIG. 1, the first end of the high voltage transistor 132 is coupled to the voltage input/output terminal I/O, the protection device 134 is coupled between the second end of the high voltage transistor 132, i.e. node Q, and the ground terminal GND, and the protection device 134 has a parasitical equivalent circuit. When the voltage input/output terminal I/O is charged according to the ESD charges, the current corresponding to the ESD charges (e.g., the positive ESD charges) can flow from the voltage input/output terminal I/O through the high voltage transistor 132 and the equivalent circuit in the protection device 134 toward the ground terminal GND.

In one embodiment, the protection device 134 can be a bipolar junction transistor (BJT) which has a parasitical equivalent circuit (e.g. equivalent circuit consisted of two opposite connected diodes), and the protection device 134 also can be a transistor having a parasitical BJT equivalent circuit. In another embodiment, the protection device 134 can be a silicon controlled rectifier (SCR) or have a parasitical SCR equivalent circuit. The SCR equivalent circuit is an electronic circuit with semiconductor interfaces of P/N/P/N.

In yet another embodiment, the protection device 134 can be a MOSFET M2, e.g. lateral diffusion metal-oxide-semiconductor field effect transistor (LDMOS), high voltage metal-oxide-semiconductor field effect transistor (HVMOS), etc., in which the first end of the transistor M2 is coupled to the second end of the high voltage transistor 132, i.e. node Q, and the second end of the transistor M2 is coupled to the ground terminal GND.

In still another embodiment, the high voltage device 130 can further include an equivalent resistor R. The equivalent resistor R is coupled between a control end of the MOSFET M2 and the ground terminal GND such that the large current corresponding to the ESD charges can flow as much as possible toward the MOSFET M2, so as to effectively discharge the large current corresponding to the ESD charges through the MOSFET M2. In practice, the equivalent resistor R can be a poly resistor, a diffusion resistor, a well resistor, etc., or can be implemented by a transistor.

Figure 3:
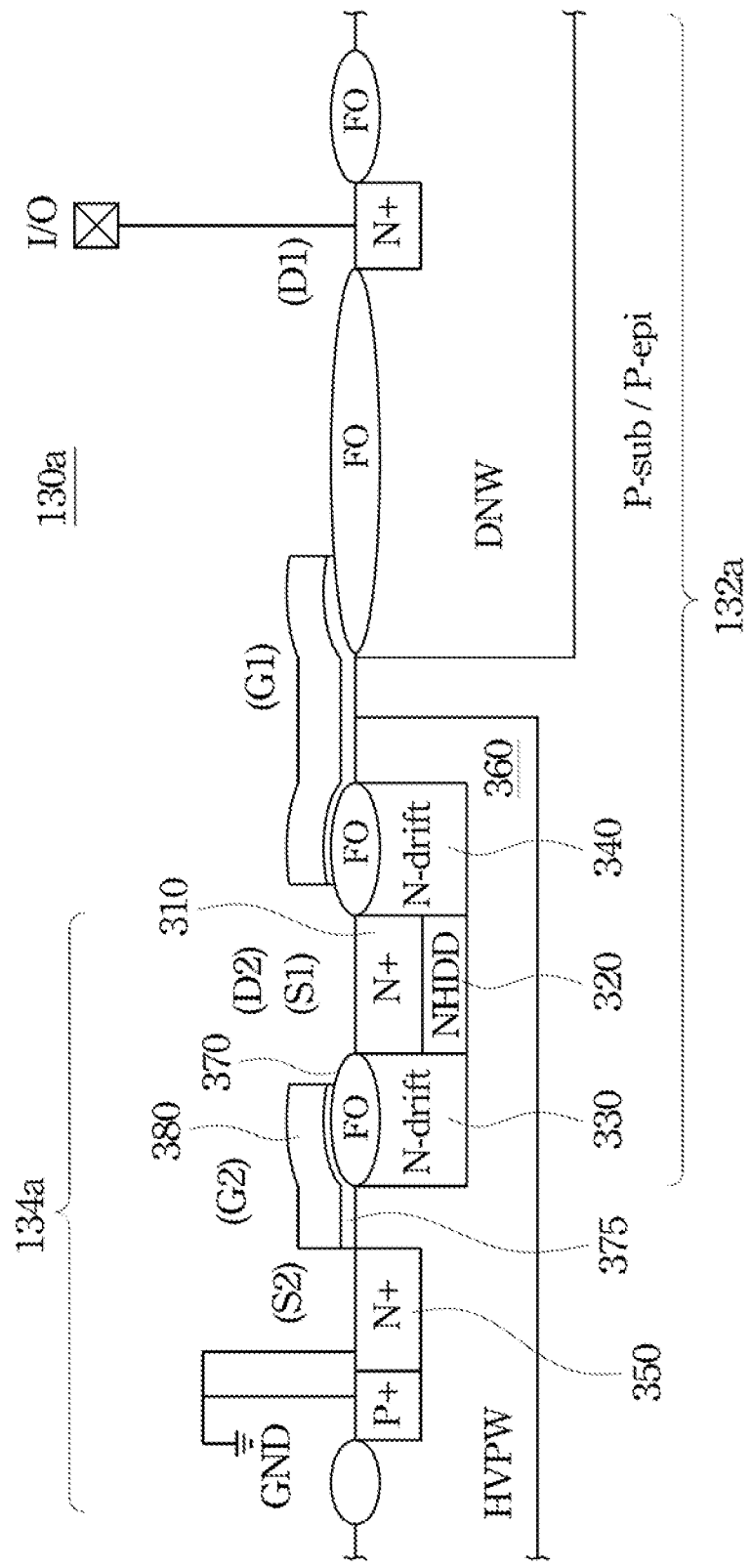
FIG. 3 is a cross section diagram of the high voltage device shown in FIG. 1 according to one embodiment of the present invention.

FIG. 3 is a cross section diagram of the high voltage device shown in FIG. 1 according to one embodiment of the present invention. As illustrated in FIG. 3, the protection device 134a can be integrated with the high voltage transistor 132a and particularly can be integrated in the same planar structure by a manner of lateral fabrication. Specifically, the high voltage transistor 132a and the protection device 134a can share at least one semiconductor layer, such that both can be laterally integrated in the same planar structure. For example, when the high voltage transistor 132a and the protection device 134a are separately implemented by a lateral diffusion metal-oxide-semiconductor field effect transistor (LDMOS), a high voltage metal-oxide-semiconductor field effect transistor (HVMOS), a bipolar junction transistor (BJT), etc., the high voltage transistor 132a and the protection device 134a can share a heavily doped layer.

In the present embodiment, the high voltage transistor 132a includes, for example, a drain electrode (D1), a gate electrode (G1) and a source electrode (S1), and the protection device 134a includes, for example, a drain electrode (D2), a gate electrode (G2) and a source electrode (S2), in which the source electrode (S1) of the high voltage transistor 132a and the drain electrode (D2) of the protection device 134a at least share an N-type heavily doped layer 310, and the dopant dosage of the N-type heavily doped layer 310 may lie between $1\times10^{14}$-$9\times10^{15}$ 1/cm$^2$. In addition, the protection device 134a can further include an N-type buffer layer 320, in which the N-type heavily doped layer 310 is formed in the N-type buffer layer 320. The dopant dosage of the N-type buffer layer 320 is lower than that of the N-type heavily doped layer 310, and the N-type buffer layer 320 can be, for example, N-type high voltage doped drain (NHDD) layer having a dopant dosage of about $8\times10^{11}$-$8\times10^{13}$ 1/cm$^2$, N-drift layer having a dopant dosage of about $5.5\times10^{11}$-$5.5\times10^{13}$ 1/cm$^2$, or N-well region having a dopant dosage of about $1\times10^{12}$-$1\times10^{14}$ 1/cm$^2$. In another embodiment, the N-type heavily doped layer 310 also can be not disposed in any buffer layer and disposed directly in a P-type substrate (P-sub), a P-type epitaxy layer (P-epi) or other P-type doped layers. Moreover, the protection device 134a can further include an N-type drift diffusion layer 330, in which the N-type drift diffusion layer 330 coupled adjacently to the N-type heavily doped layer 310 and the N-type buffer layer 320. In one embodiment, the dopant dosage and length of the N-type drift diffusion layer 330 may affect the breakdown voltage and turn-on resistance ($R_{on}$) of the protection device 134a. The dopant dosage and length are known by persons of ordinary skill in the art, and persons of ordinary skill in the art can adjust the dopant dosage and length according to practical needs.

For semiconductor structure, the source electrode (S1) of the high voltage transistor 132a can include the foregoing N-type heavily doped layer 310, and the drain electrode (D2) of the protection device 134a can include the foregoing N-type heavily doped layer 310 at the same time, such that the source electrode (S1) of the high voltage transistor 132a can be the drain electrode (D2) of the protection device 134a at the same time.

Further, the protection device 134a can further include a field oxide layer 370 (also denoted as FO in the figure) and a gate layer 380, in which the field oxide layer 370 is formed on the N-type drift diffusion layer, and the gate layer 380 is separated from the field oxide layer 370 by a gate dielectric layer 375 and formed on the field oxide layer 370, such that the gate layer 380 can be provided as the gate electrode (G2) of the protection device 134a. In practice, the field oxide layer 370 can be formed by a local oxidation of silicon (LOCOS) manner.

In addition, in the present embodiment, the drain electrode (D1) of the high voltage transistor 132a is coupled to the voltage input/output terminal I/O, the source electrode (S2) of the protection device 134a is coupled to the ground terminal GND, and the protection device 134a has a parasitical equivalent circuit. When the voltage input/output terminal I/O is charged according to the ESD charges, the current corresponding to the ESD charges (e.g positive charge) can flow from the voltage input/output terminal I/O through the high voltage transistor 132a and the equivalent circuit in the protection device 134a toward the ground terminal GND, to achieve the effect of ESD protection.

In one embodiment, the protection device 134 shown in FIG. 1 can be a bipolar junction transistor (BJT). In another embodiment, the protection device 134 can have a parasitical BJT equivalent circuit. Taking the embodiment for example, the protection device 134a can include another N-type heavily doped layer 350 and a doped layer 360, in which the N-type heavily doped layer 350 is formed in the doped layer 360, and the N-type buffer layer 320 and the N-type drift diffusion layers 330, 340 are also formed in the doped layer 360. The doped layer 360 can be a P-type doped region such as P-type well semiconductor layer, P-type substrate (P-sub), P-type epitaxy layer (P-epi). The protection device 134a and the source electrode (S1) of the high voltage transistor 132a can share the doped layer 360. The N-type heavily doped layer 350 and the N-type drift diffusion layer 330 are separately disposed. The N-type heavily doped layer 350 is coupled to the ground terminal GND and provided as an emitter of the parasitical BJT equivalent circuit in the protection device 134a. The doped layer 360 is provided as a base of the parasitical BJT equivalent circuit in the protection device 134a.

Figure 4:
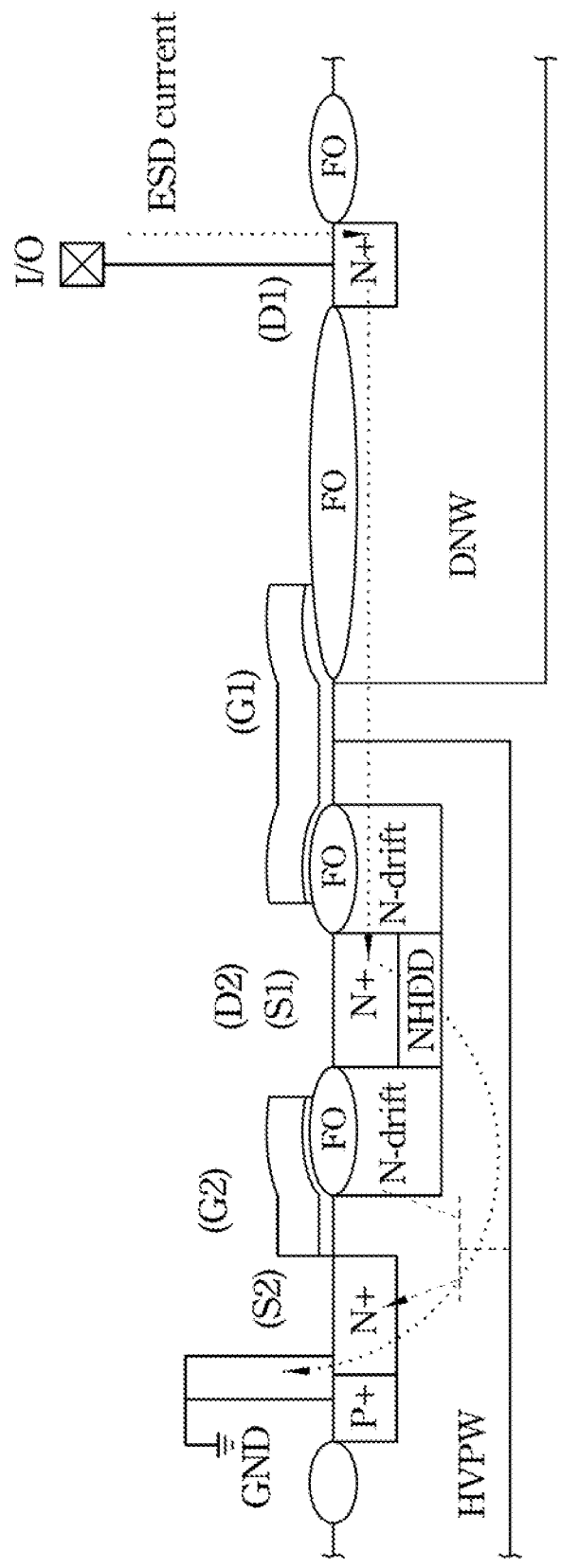
FIG. 4 is a diagram of ESD protection operation of the high voltage device shown in FIG. 3.

Accordingly, under the condition of the protection device 134a having the parasitical BJT equivalent circuit, the N-type heavily doped layer 350 is provided as the emitter of the BJT equivalent circuit, the doped layer 360 is provided as the base of the BJT equivalent circuit, and the N-type drift diffusion layer 330 is provided as a portion of the collector of the BJT equivalent circuit, such that when the voltage input/output terminal I/O is charged according to the ESD charges, the large current corresponding to the ESD charges can flow from the voltage input/output terminal I/O through the high voltage transistor 132a and the BJT equivalent circuit in the protection device 134a toward the ground terminal GND, to achieve the effect of ESD protection. The example for the operation of ESD protection can be referred to as illustrated in FIG. 4.

Figure 5:
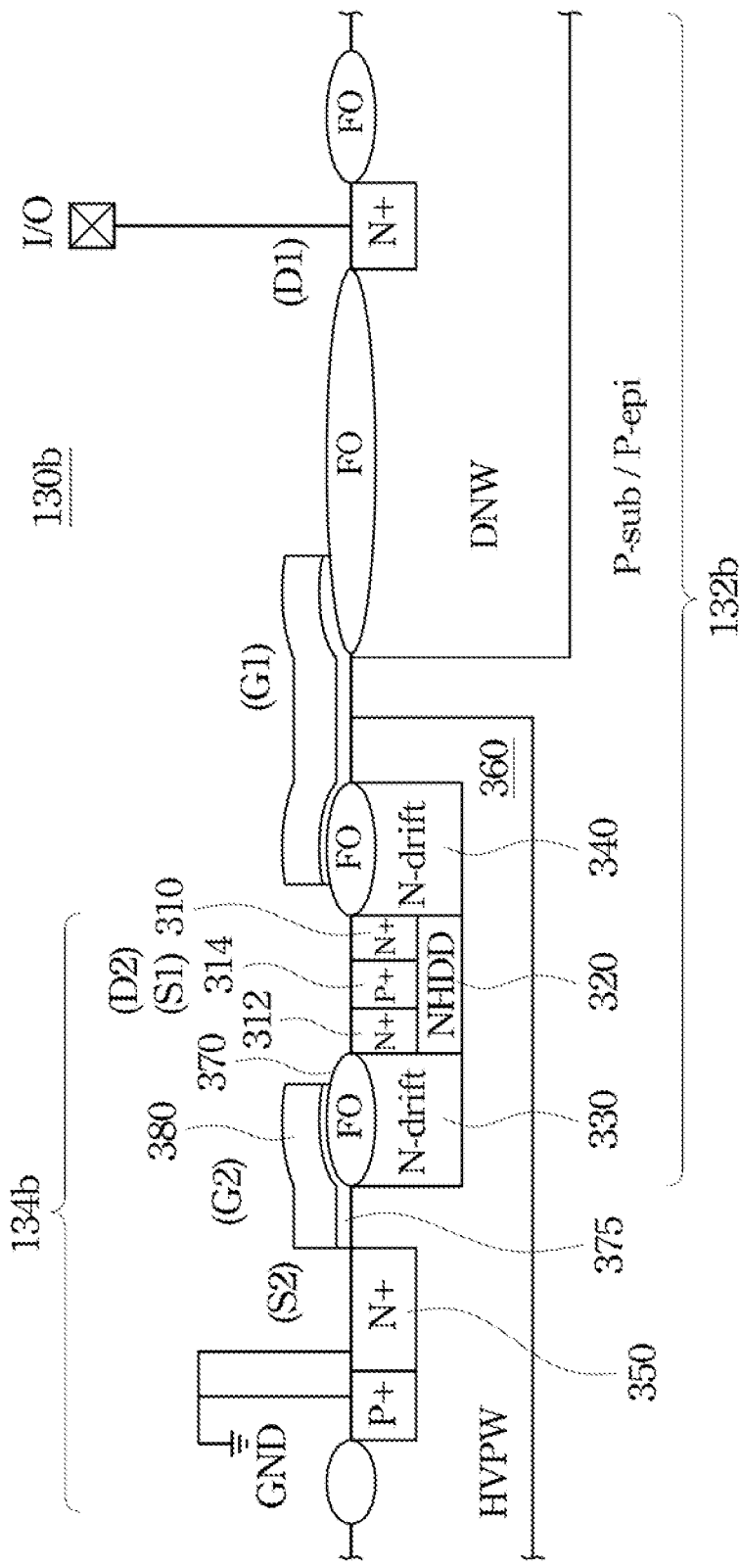
FIG. 5 is a cross section diagram of the high voltage device shown in FIG. 1 according to another embodiment of the present invention.

On the other hand, in another embodiment, the protection device 134 shown in FIG. 1 can be a silicon controlled rectifier (SCR) or a transistor having a parasitical SCR equivalent circuit. FIG. 5 is a cross section diagram of the high voltage device shown in FIG. 1 according to another embodiment of the present invention. Compared to FIG. 3, the drain electrode (D2) of the protection device 134b further includes another N-type heavily doped layer 312. The protection device 134b can further include a P-type heavily doped layer 314, in which the P-type heavily doped layer 314 is coupled adjacently between the N-type heavily doped layer 310 and the N-type heavily doped layer 312 and provided as an anode of the parasitical SCR equivalent circuit in the protection device 134b. The N-type heavily doped layer 350 is provided as a cathode of the parasitical SCR equivalent circuit in the protection device 134b. The SCR (or SCR equivalent circuit) is an electronic circuit with semiconductor interfaces of P/N/P/N, so based on the semiconductor structure of the present embodiment, there can be a SCR equivalent circuit parasitized between the drain electrode (D2) and source electrode (S2) of the protection device 134b.

Figure 6:
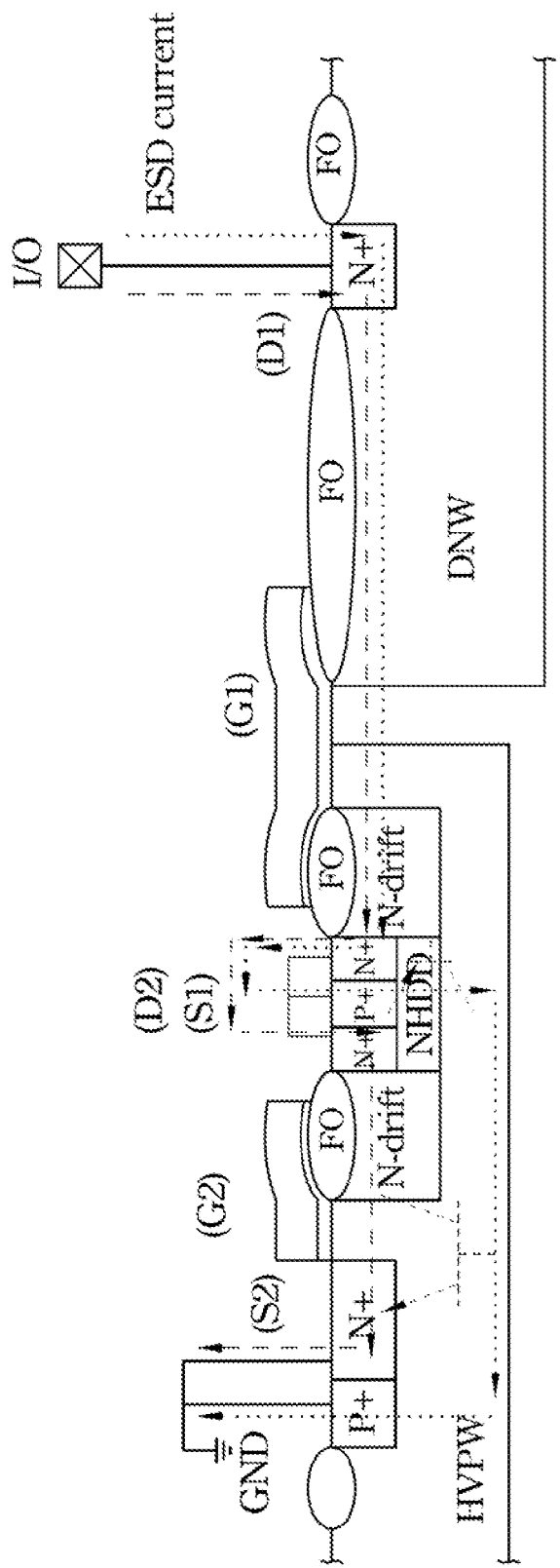
FIG. 6 is a diagram of ESD protection operation of the high voltage device shown in FIG. 5.

Accordingly, under the condition of the protection device 134b having the parasitical SCR equivalent circuit, the P-type heavily doped layer 314 is provided as the anode of the SCR equivalent circuit, and the N-type heavily doped layer 350 is provided as the cathode of the SCR equivalent circuit, such that when the voltage input/output terminal I/O is charged according to the ESD charges, the large current corresponding to the ESD charges can flow from the voltage input/output terminal I/O through the high voltage transistor 132b and the SCR equivalent circuit in the protection device 134b toward the ground terminal GND, to achieve the effect of ESD protection. The example for the operation of ESD protection can be referred to as illustrated in FIG. 6.

Figure 7:
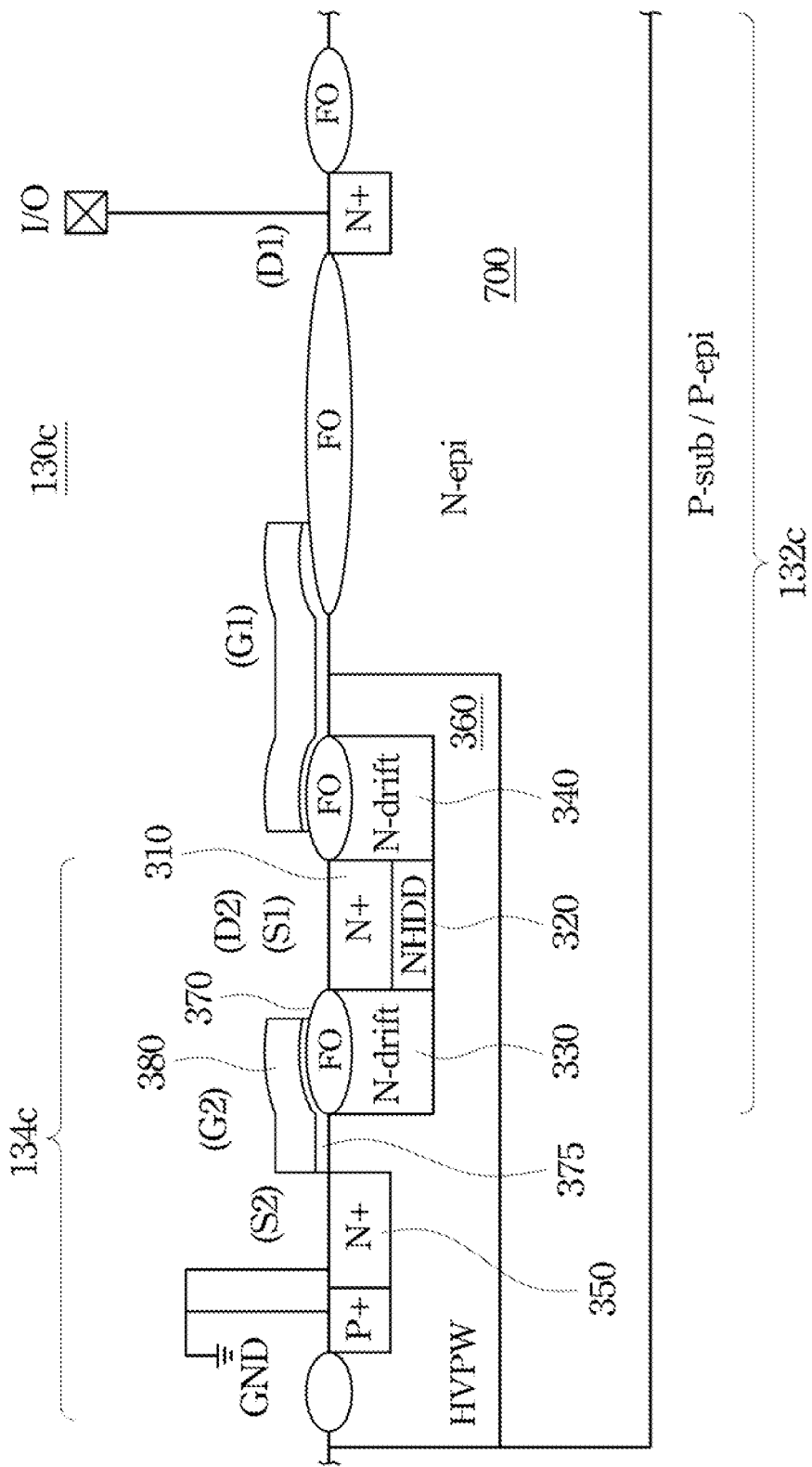
FIG. 7 is a cross section diagram of the high voltage device shown in FIG. 1 according to yet another embodiment of the present invention.

FIG. 7 is a cross section diagram of the high voltage device shown in FIG. 1 according to yet another embodiment of the present invention. Compared to FIG. 3, in the high voltage device 130c shown in FIG. 7, an N-type epitaxy layer (N-epi) 700 is formed on the P-type substrate (P-sub) or P-type epitaxy layer (P-epi), and each semiconductor layer of the protection device 134c and the high voltage transistor 132c is fabricated on the N-type epitaxy layer 700; that is, the protection device 134c and the high voltage transistor 132c share the N-type epitaxy layer 700. In the present embodiment, the operation of ESD protection for the high voltage device 130c can be similar to that shown in FIG. 4.

Figure 8:
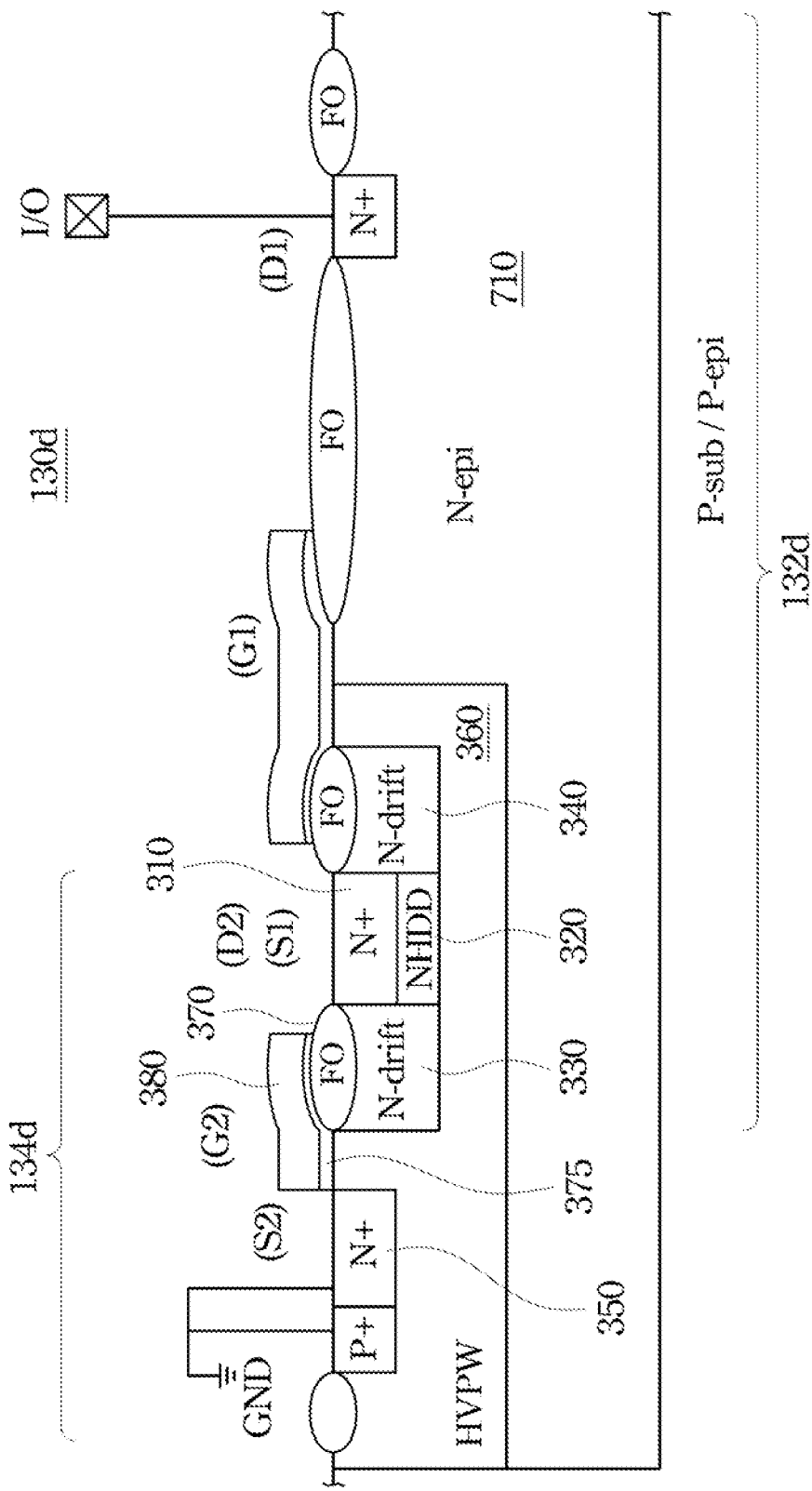
FIG. 8 is a cross section diagram of the high voltage device shown in FIG. 1 according to still another embodiment of the present invention.

FIG. 8 is a cross section diagram of the high voltage device shown in FIG. 1 according to still another embodiment of the present invention. Compared to FIG. 5, in the high voltage device 130d shown in FIG. 8, an N-type epitaxy layer (N-epi) 710 is formed on the P-type substrate (P-sub) or P-type epitaxy layer (P-epi), and each semiconductor layer of the protection device 134d and the high voltage transistor 132d is fabricated on the N-type epitaxy layer 710; that is, the protection device 134d and the high voltage transistor 132d share the N-type epitaxy layer 710. In the present embodiment, the operation of ESD protection for the high voltage device 130d can be similar to that shown in FIG. 6.

The foregoing high voltage device can be applied in various electronic apparatuses and can provide ESD protection in response to various operational conditions. FIG. 9 to FIG. 12 are diagrams of ESD protection operations of the high voltage device, shown in FIG. 1, under various conditions according to embodiments of the present invention.

Figure 9:
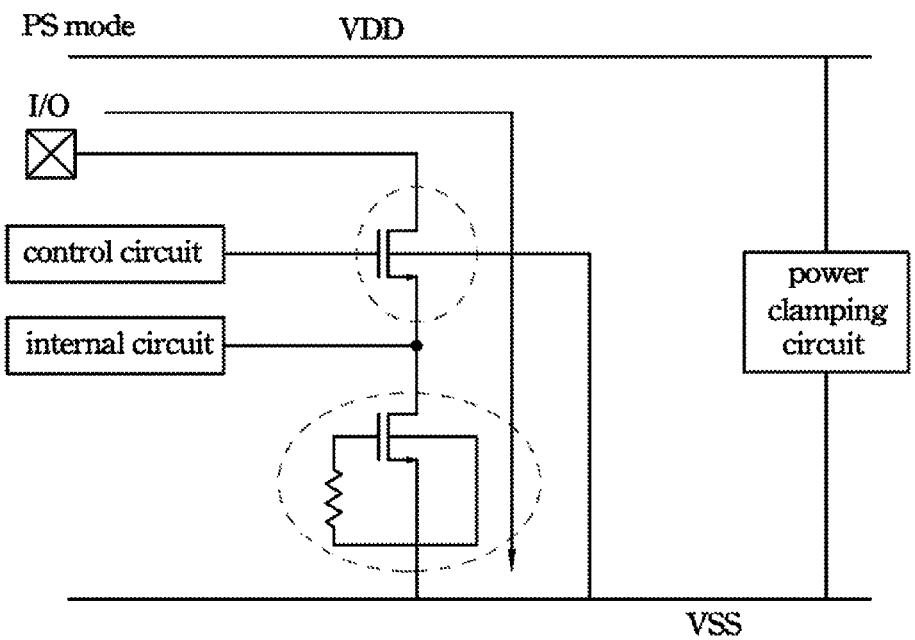
FIG. 9 to FIG. 12 are diagrams of ESD protection operations of the high voltage device, shown in FIG. 1, under various conditions according to embodiments of the present invention.

In FIG. 9, when a human body or object carrying positive charges touches the voltage input/output terminal I/O and the ground terminal GND touches a ground potential (the condition herein referred to as PS mode), the current corresponding to ESD charges can flow from the voltage input/output terminal I/O through the high voltage transistor and the protection device toward the ground terminal GND, to achieve the effect of ESD protection.

Figure 10:
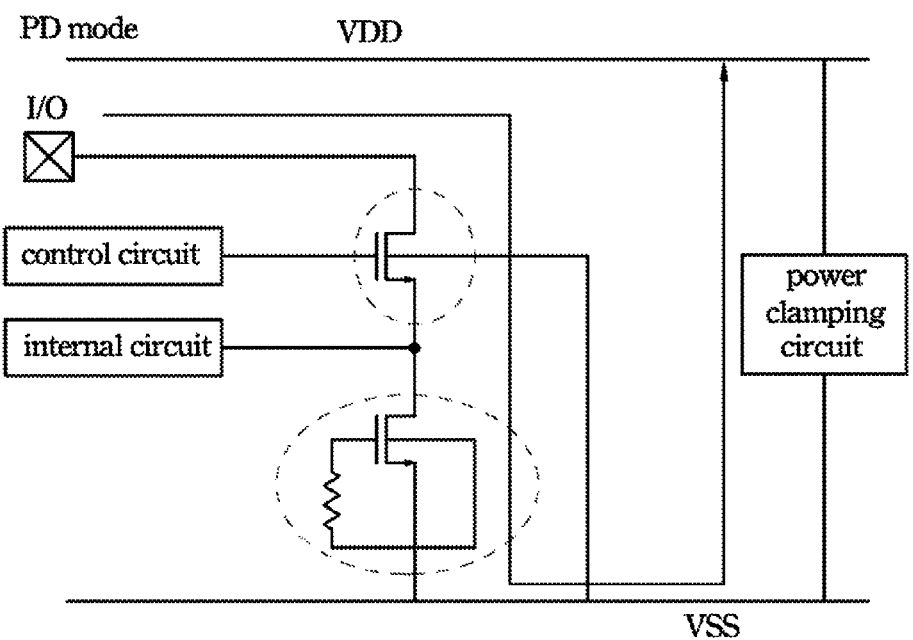

In FIG. 10, when a human body or object carrying positive charges touches the voltage input/output terminal I/O and the power supply terminal VDD touches the ground potential (the condition herein referred to as PD mode), the current corresponding to ESD charges can flow from the voltage input/output terminal I/O through the high voltage transistor and the protection device (which is reverse-biased) toward the ground terminal GND, and then flow through a power clamping circuit (which is forward-biased) toward the power supply terminal VDD, to achieve the effect of ESD protection.

Figure 11:
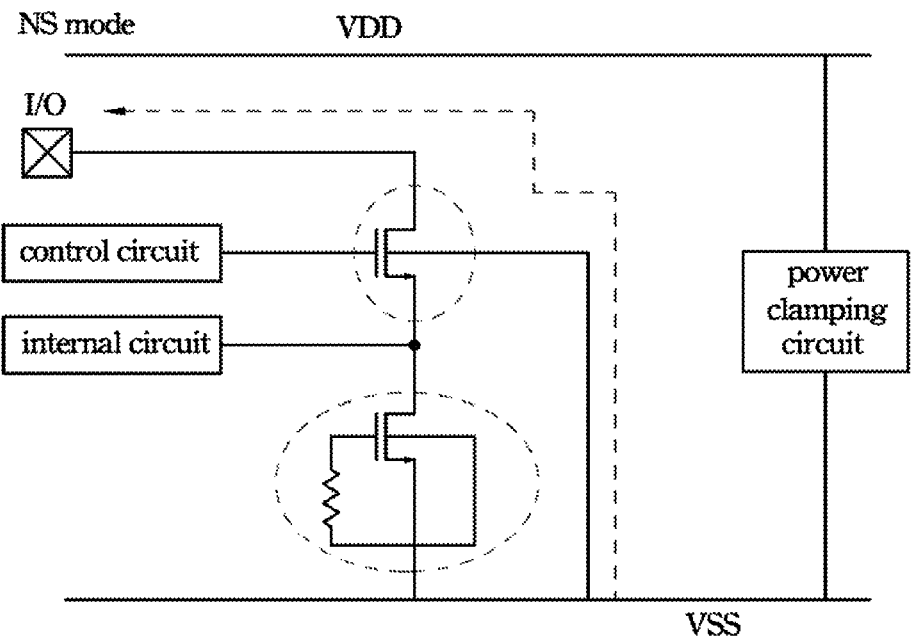

In FIG. 11, when a human body or object carrying negative charges touches the voltage input/output terminal I/O and the ground terminal GND touches the ground potential (the condition herein referred to as NS mode), the current corresponding to ESD charges can flow from the ground terminal GND through the high voltage transistor (e.g. through the forward-biased parasitical diode therein) toward the voltage input/output terminal I/O, to achieve the effect of ESD protection.

Figure 12:
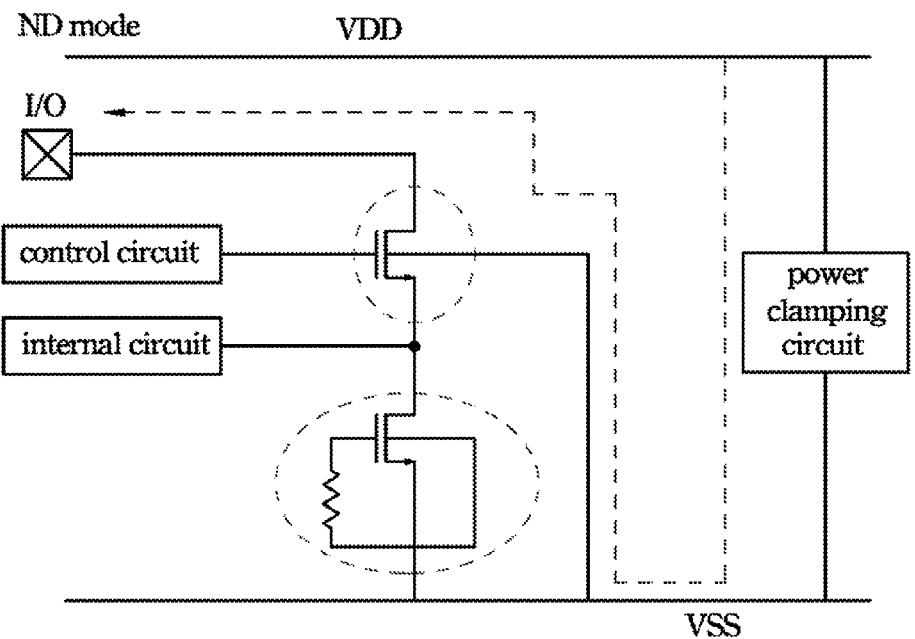

In FIG. 12, when a human body or object carrying negative charges touches the voltage input/output terminal I/O and the power supply terminal VDD touches the ground potential (the condition herein referred to as ND mode), the current corresponding to ESD charges can flow from the power supply terminal VDD through the power clamping circuit (which is reverse-biased) toward the ground terminal GND, and then flow through the high voltage transistor (e.g. through the forward-biased parasitical diode therein) toward the voltage input/output terminal I/O, to achieve the effect of ESD protection.

Traditionally, when the ESD condition happens so that the momentary large current is generated, a conventional high voltage device cannot prevent the electronic apparatus from being damaged by ESD, and the momentary large current generated due to ESD may flow through the high voltage device toward other internal circuits, such that elements in the internal circuits are damaged.

Compared to that mentioned above, in the embodiments of the present invention, when the high voltage transistor is fabricated, the ESD protection device can be fabricated at one side of the semiconductor structure of the high voltage transistor by an integration manner (e.g. embedded), so as to enhance the ESD protection capability of the entire circuit.

In addition, for layouts of integrated circuit chips, by utilizing the foregoing manner of integrating the high voltage transistor with the ESD protection device, the integrated total area can be approximately the same as the area necessary for the high voltage transistor itself under conventional layout schemes (e.g. multiple edges layout, circular layout). Under the layout scheme of finger type, the integrated total area is also only larger than the area necessary for the high voltage transistor itself by approximately 1.6%. Under the condition that the total area has no substantial change, utilizing the foregoing high voltage device can thus enhance the entire ESD protection capability.

On the other hand, when the ESD event happens, ESD charges may be generated to result in a large amount of currents flowing into the electronic apparatus during a short continuous period, in which the large amount of currents may be generated from various sources (e.g. human body or machine). The following Table I illustrates the test data of HBM (human body mode) of various devices under the condition of carrying electrostatic charges.

As can be seen in Table I, compared to the test data of using only the original high voltage device without protection device, the HBM test data of the high voltage device (including high voltage transistor supplying voltage of 5V for internal circuit) in the embodiments of the present invention can be obtained up to 5.25 KV. The HBM test data of the high voltage device (including high voltage transistor supplying voltage of 20V for internal circuit) in other embodiments of the present invention can be obtained up to 5.25 KV as well. The ESD protection capability of the high voltage device in the embodiments of the present invention is apparently enhanced.

TABLE I

| device | HBM test sample | | |
|---|---|---|---|
| | $1^{st}$ sample | $2^{nd}$ sample | $3^{rd}$ sample |
| original high voltage device | 0.75 KV | 0.75 KV | 0.5 KV |
| high voltage device in the embodiment of the present invention (including high voltage transistor supplying voltage of 5 V for internal circuit) | 5.25 KV | 4.75 KV | 4.75 KV |
| high voltage device in the embodiment of the present invention (including high voltage transistor supplying voltage of 20 V for internal circuit) | 4.75 KV | 5.25 KV | 2.5 KV |

Figure 13:
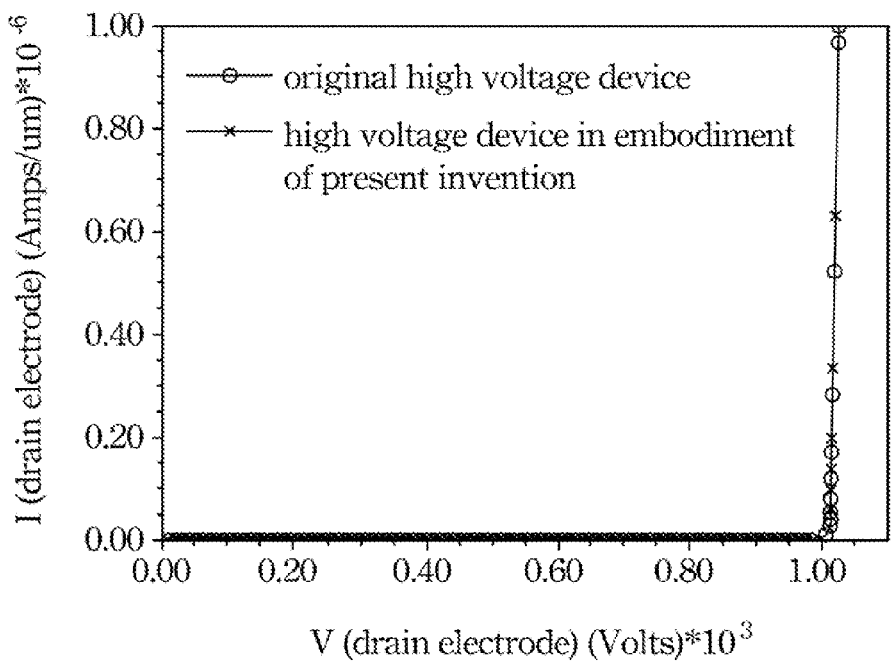
FIG. 13 is a simulation diagram of comparison between breakdown voltages of the original high voltage device and the high voltage device in the embodiment of the present invention.
Figure 14:
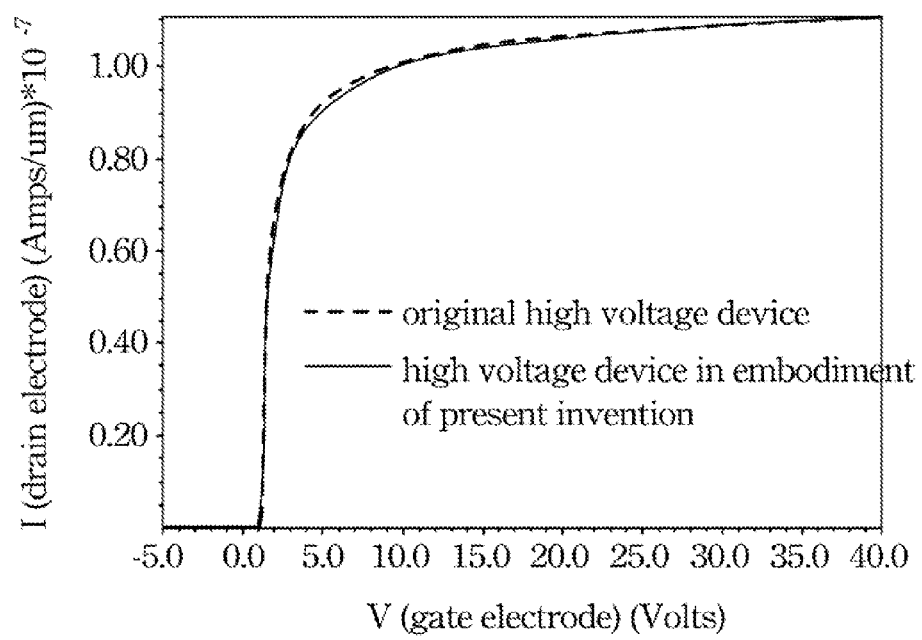
FIG. 14 is a simulation diagram of comparison between electric characteristics of the original high voltage device and the high voltage device in the embodiment of the present invention.
Figure 1:
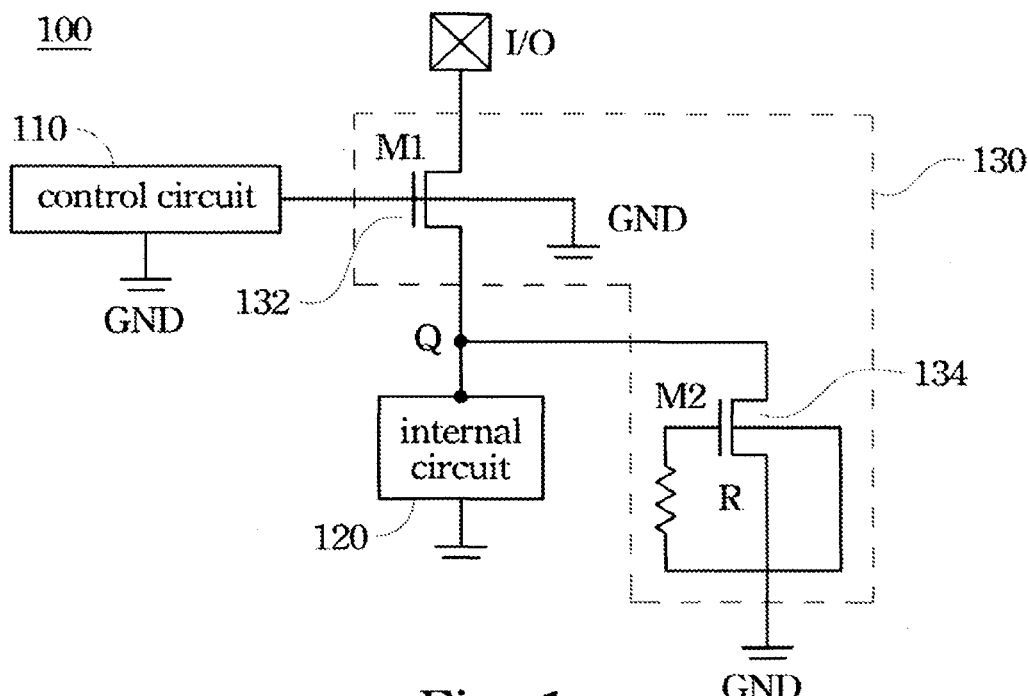
Figure 2:
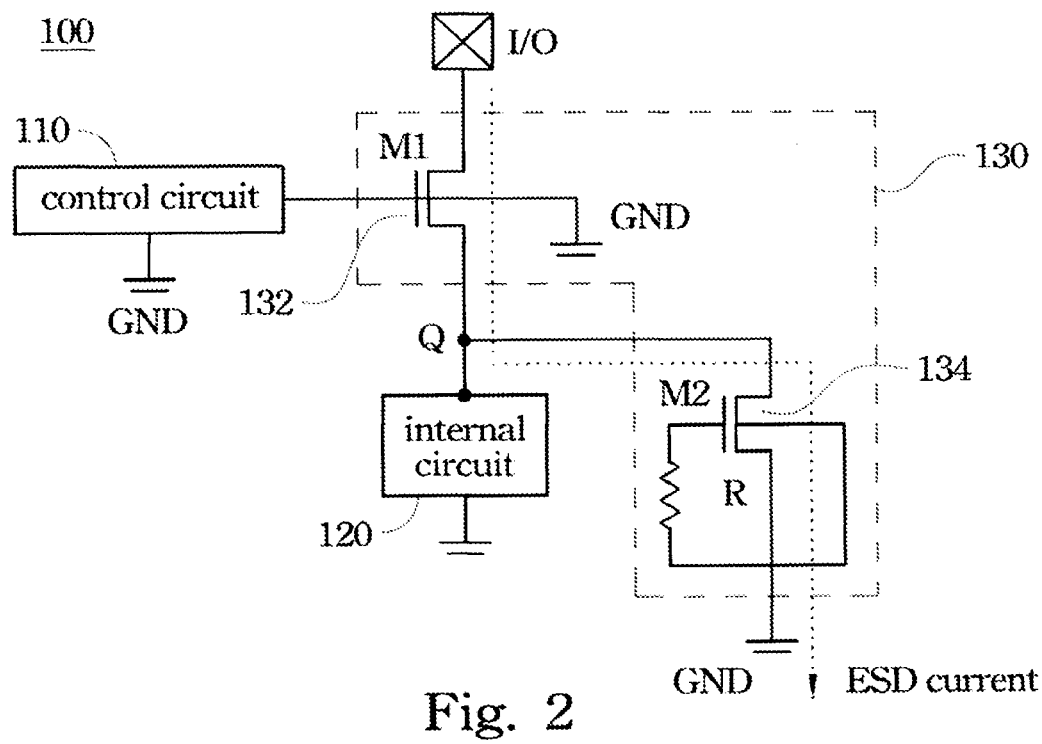
Figure 3:
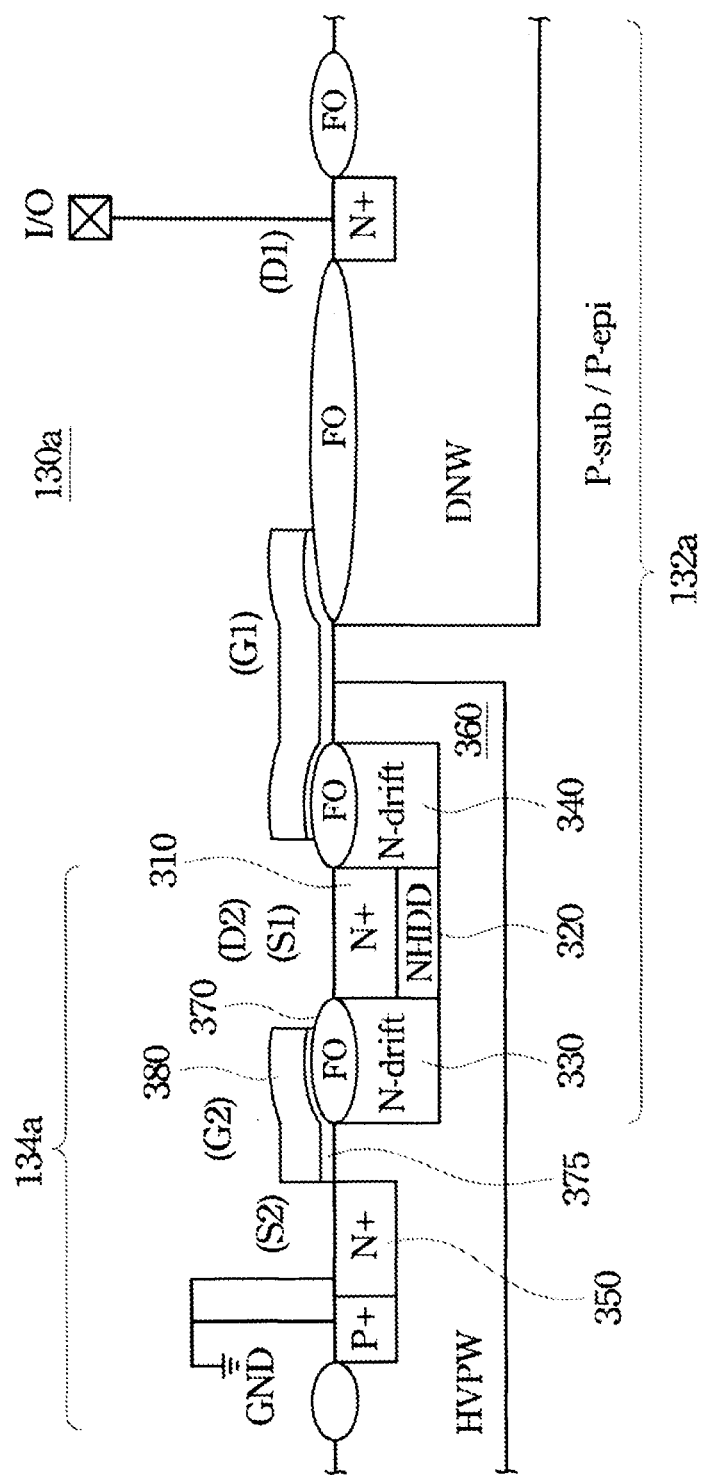
Figure 4:
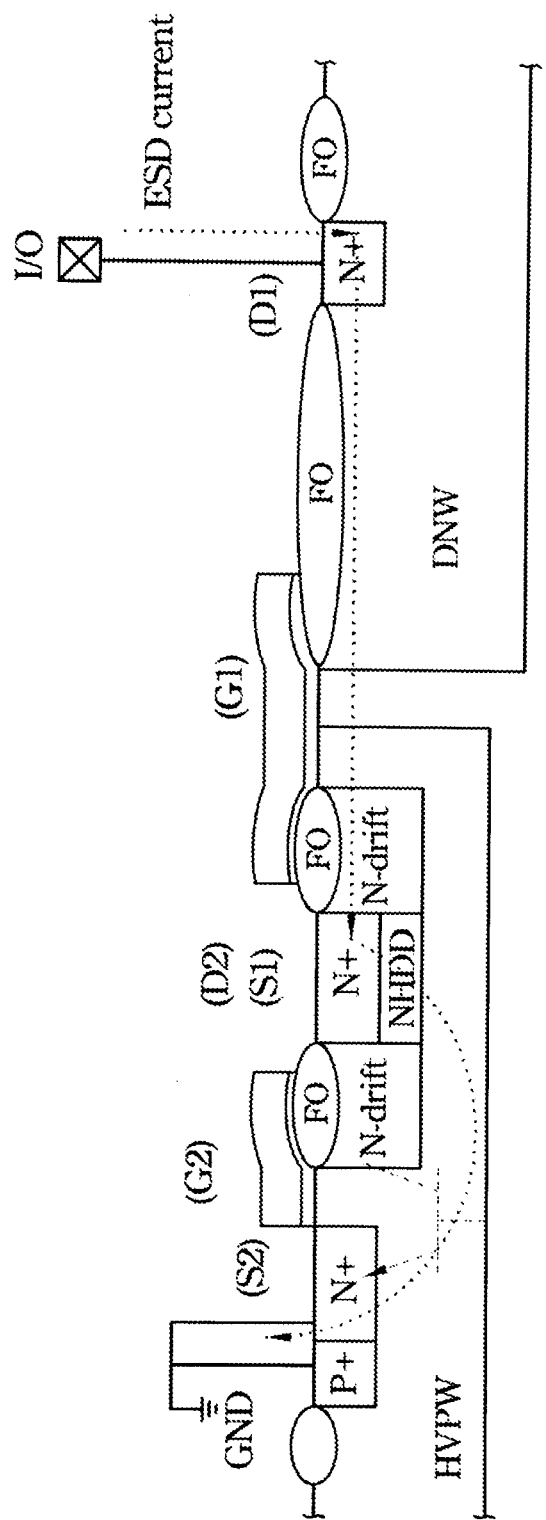
Figure 5:
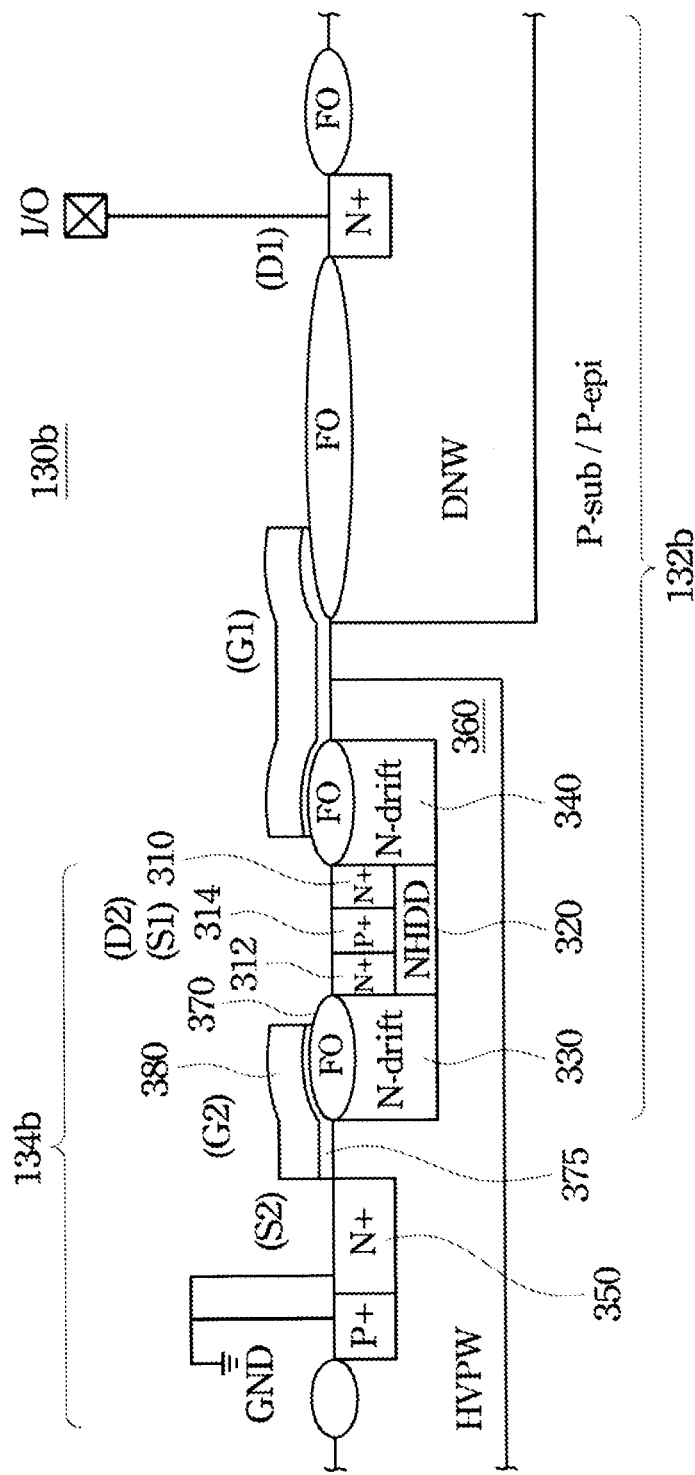
Figure 6:
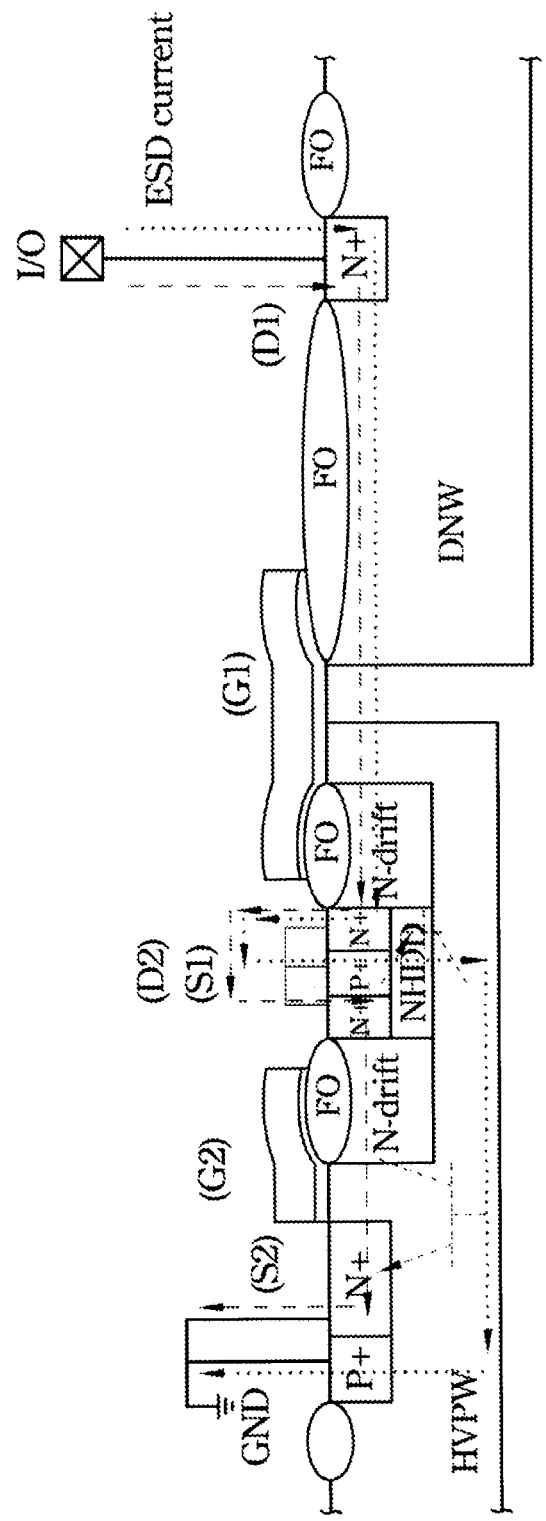
Figure 7:
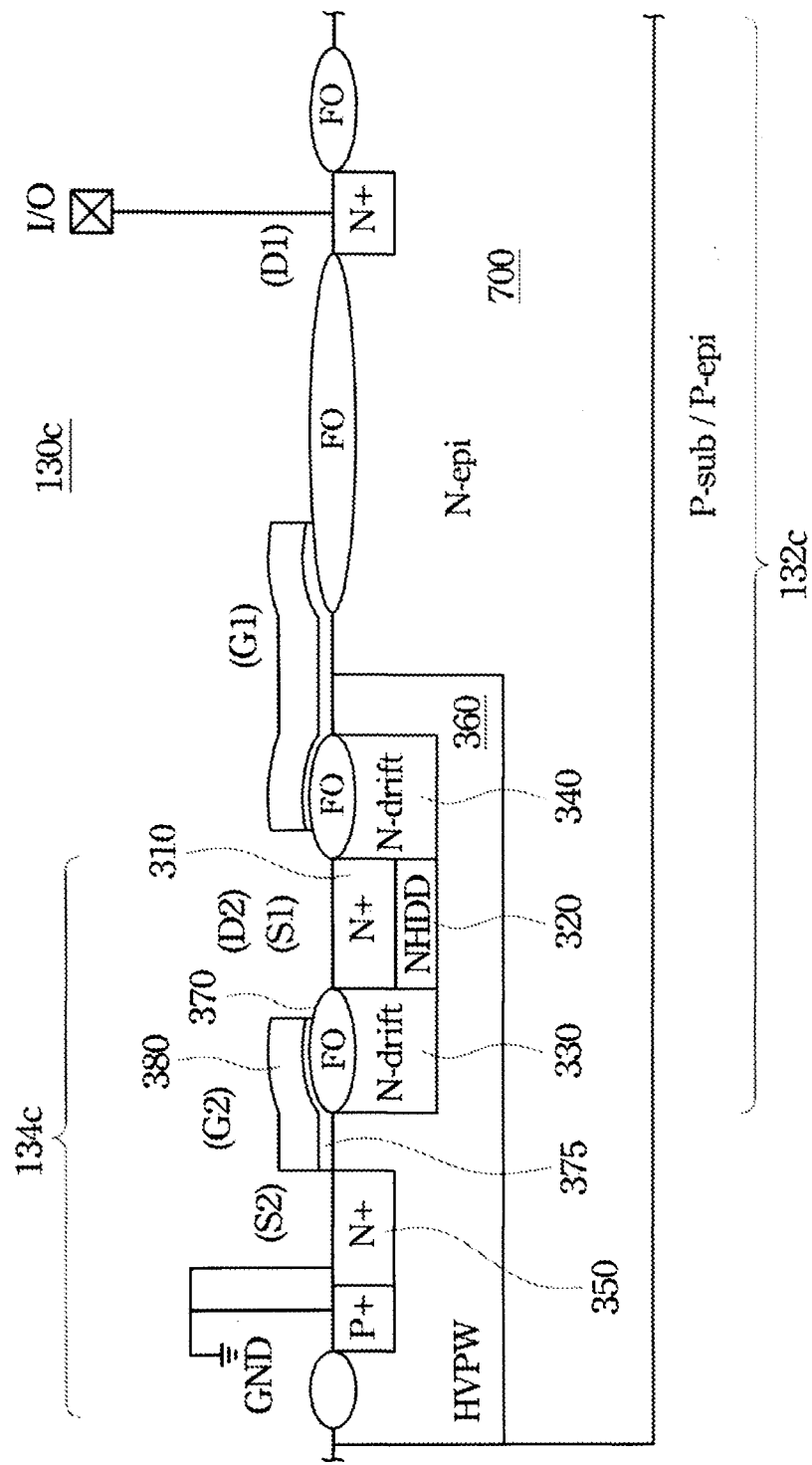
Figure 8:
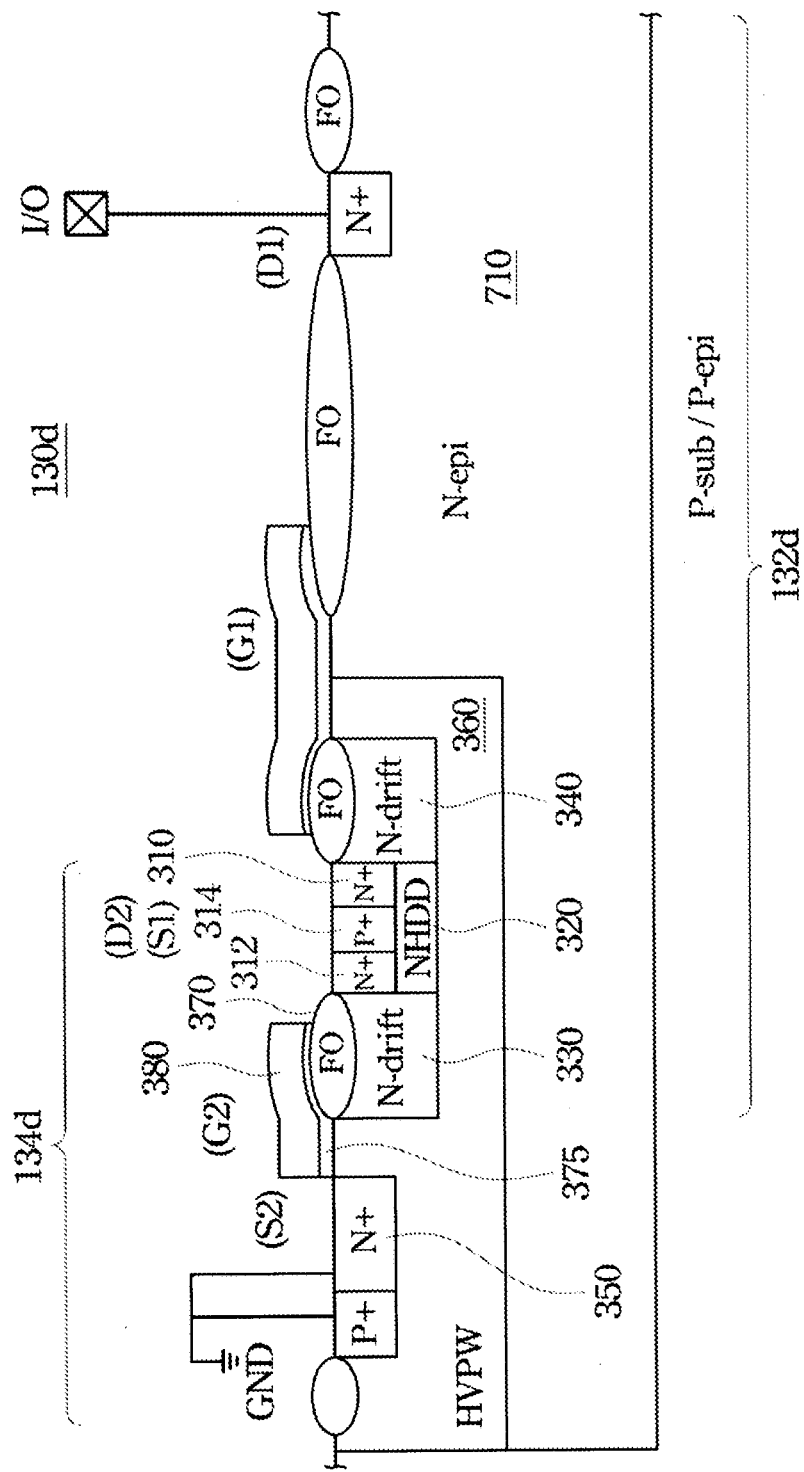
Figure 9:
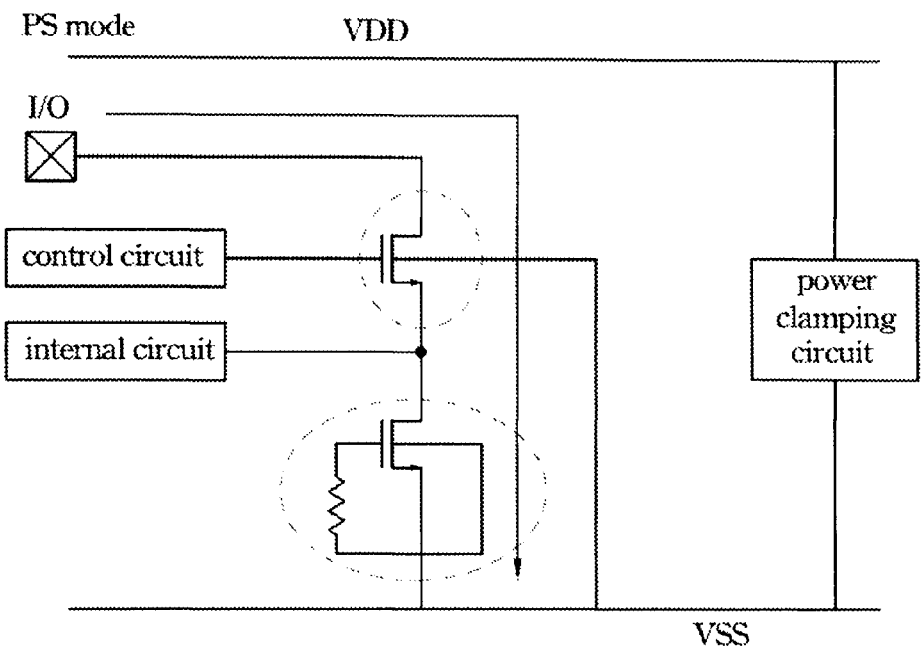
Figure 10:
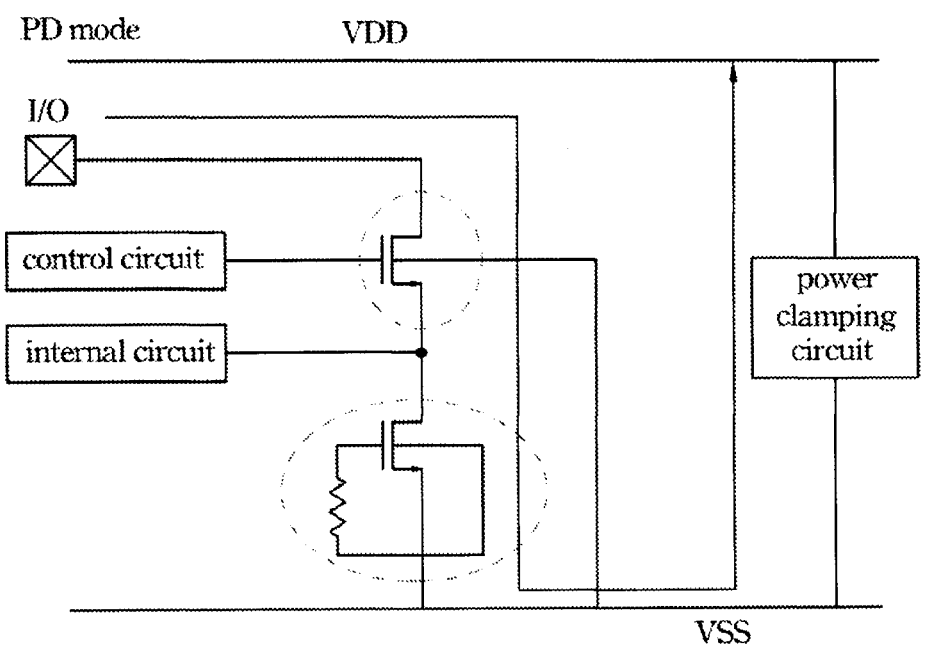
Figure 11:
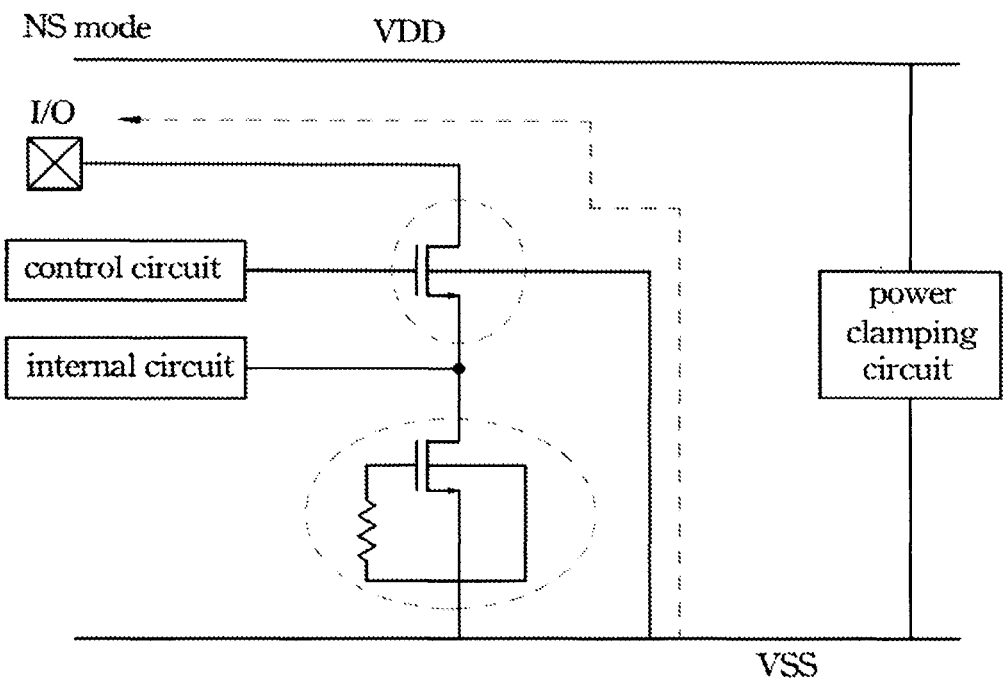
Figure 12:
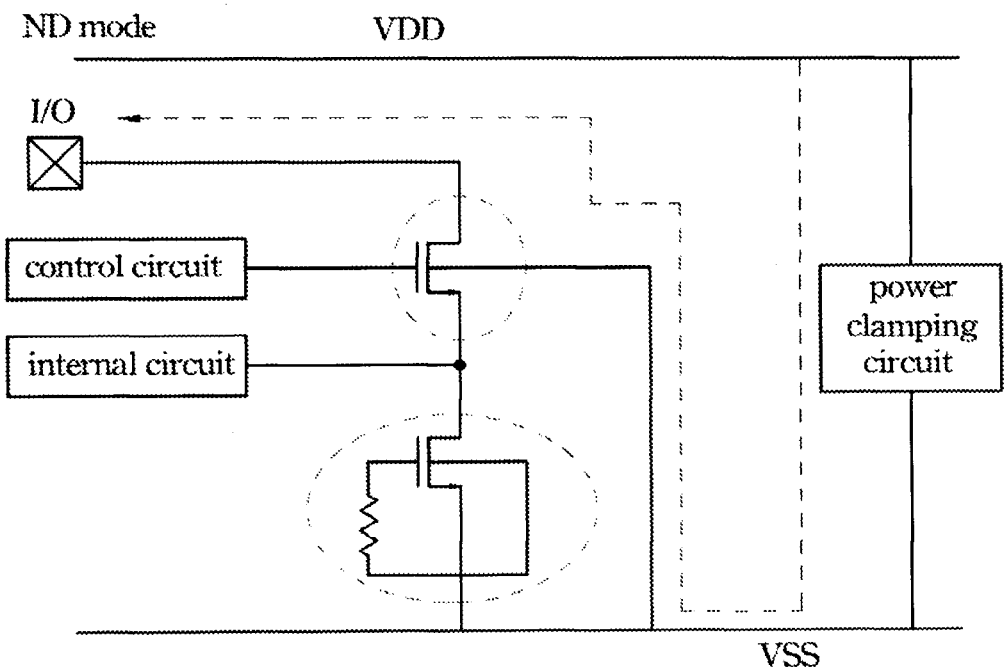
Figure 13:
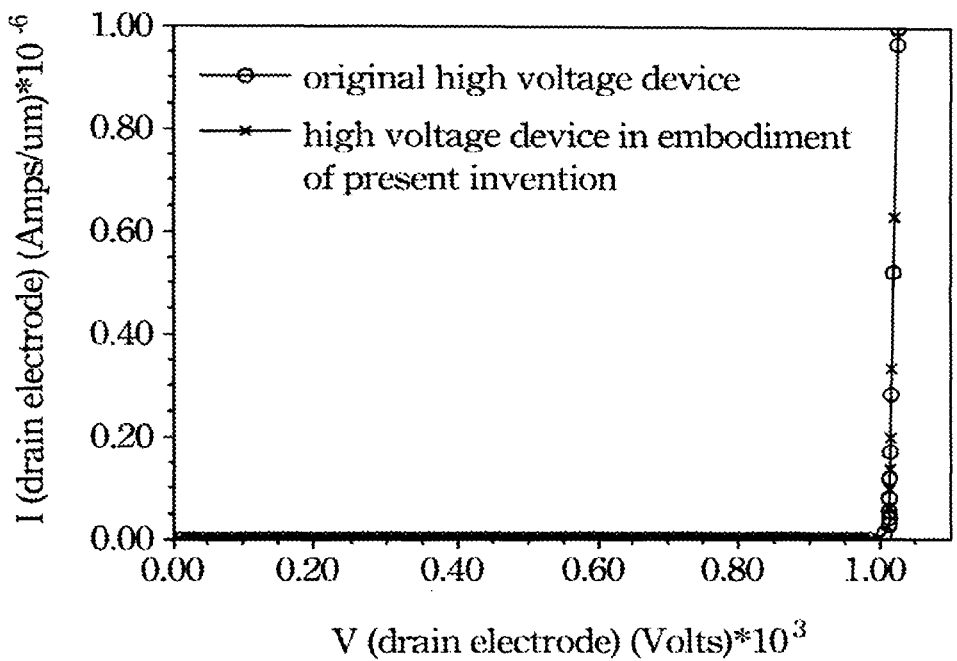
Figure 14:
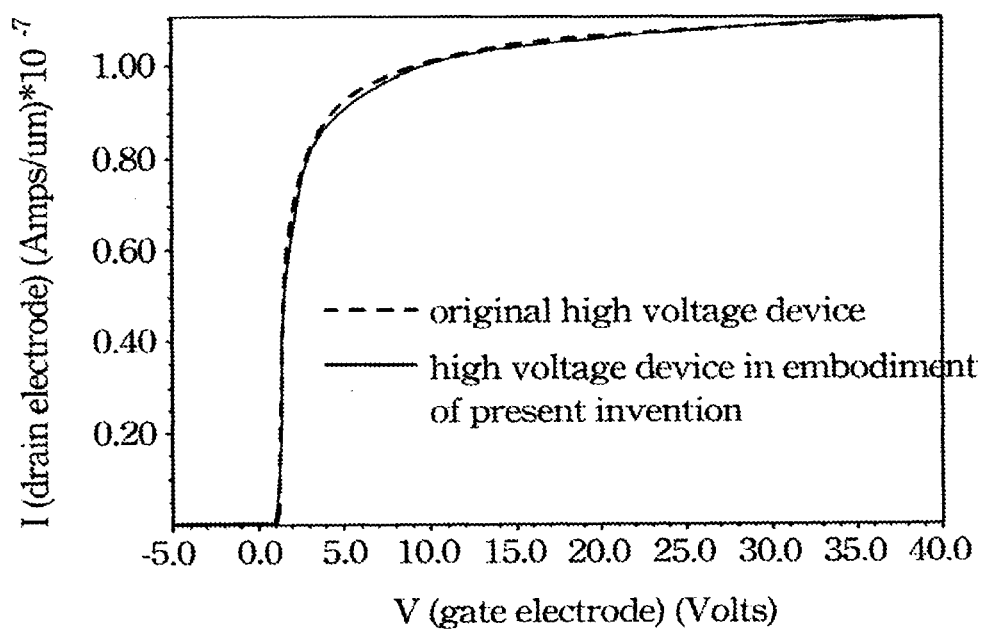

FIG. 13 is a simulation diagram of comparison between breakdown voltages of the original high voltage device and the high voltage device in the embodiment of the present invention. FIG. 14 is a simulation diagram of comparison between electric characteristics of the original high voltage device and the high voltage device in the embodiment of the present invention. As illustrated in FIG. 13 and FIG. 14, for the comparison of the original high voltage device with the high voltage device in the embodiment of the present invention, the breakdown voltages (BVDSS) or the electric characteristic of drain current to gate voltage (Id-Vg), of both, are substantially the same. Thus, the foregoing manner of integrating the high voltage transistor with the ESD protection device would not affect the original operations and functions of circuits.

For the embodiments of the present invention, the manner of applying the foregoing high voltage device or integrating the high voltage transistor with the ESD protection device not only can effectively enhance the ESD protection of the entire circuit, thus enhancing the capability of conducting large ESD current, but also can maintain the total layout area of the IC chip substantially the same, further maintaining the original operations and functions of the entire circuits.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

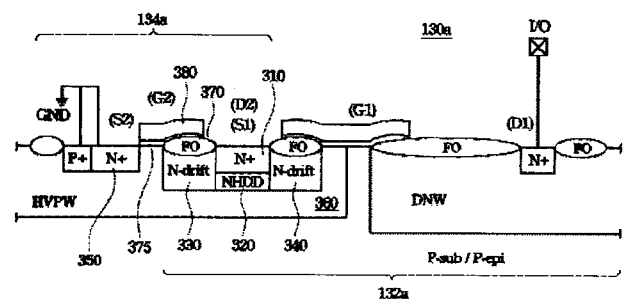

What is claimed is:

1. A semiconductor device comprising:
   a transistor having a first end and a second end, the first end being coupled to a voltage input/output terminal; and
   a protection device coupled between the second end of the transistor and a ground terminal, the protection device having a parasitical equivalent circuit, wherein when the voltage input/output terminal is charged according to positive electrostatic discharge charges, a current corresponding to the positive electrostatic discharge charges flows from the voltage input/output terminal through the transistor and the equivalent circuit in the protection device toward the ground terminal.

2. The semiconductor device as claimed in claim 1, wherein the protection device is a bipolar junction transistor (BJT), a silicon controlled rectifier (SCR), a protection component with the equivalent circuit having a parasitical bipolar junction transistor or a protection component with the equivalent circuit having a parasitical silicon controlled rectifier.

3. The semiconductor device as claimed in claim 1, wherein the protection device is a metal-oxide-semiconductor field effect transistor (MOSFET), a first end of the MOSFET is coupled to the second end of the transistor, and a second end of the MOSFET is coupled to the ground terminal.

4. The semiconductor device as claimed in claim 3, further comprising:
   an equivalent resistor oupled between a control end of the MOSFET and the ground terminal.

5. A semiconductor device comprising:
   a transistor comprising a first electrode and a second electrode; and
   a protection device comprising a second heavily doped layer, a third heavily doped layer, a third electrode and a fourth electrode, the second electrode of the transistor and the third electrode of the protection device at least sharing a first heavily doped layer, the third heavily doped layer being coupled adjacently between the first heavily doped layer and the second heavily doped layer, the third heavily doped layer being provided as an anode of a parasitical silicon controlled rectifier (SCR) equivalent circuit in the protection device.

6. The semiconductor device as claimed in claim 5, further comprising:
   a buffer layer, the first heavily doped layer being disposed in the buffer layer, a dopant dosage of the buffer layer being lower than a dopant dosage of the first heavily doped layer.

7. The semiconductor device as claimed in claim 5, wherein the protection device further comprises a drift diffusion layer coupled adjacently to the first heavily doped layer.

8. The semiconductor device as claimed in claim 5, wherein the first electrode of the transistor is coupled to a voltage input/output terminal, the fourth electrode of the protection device is coupled to a ground terminal, the protection device having a parasitical equivalent circuit, wherein when the voltage input/output terminal is charged according to positive electrostatic discharge charges, a current corresponding to the positive electrostatic discharge charges flows from the voltage input/output terminal through the transistor and the equivalent circuit in the protection device toward the ground terminal.

9. The semiconductor device as claimed in claim 5, wherein the second heavily doped layer is coupled to a ground terminal and provided as an emitter of a bipolar junction transistor (BJT) equivalent circuit in the protection device.

10. The semiconductor device as claimed in claim 9, wherein the protection device further comprises:
    a doped layer, wherein the second heavily doped layer is formed in the doped layer, and the doped layer is provided as a base of the BJT equivalent circuit in the protection device.

11. The semiconductor device as claimed in claim 5, wherein the protection device further comprises:
    a fourth heavily doped layer coupled to a ground terminal and provided as a cathode of the parasitical SCR equivalent circuit in the protection device.

12. The semiconductor device as claimed in claim 11, wherein the protection device further comprises a doped layer, and the protection device and the second electrode of the transistor share the doped layer.

13. The semiconductor device as claimed in claim 11, further comprising:
    an epitaxy layer, the protection device and the transistor sharing the epitaxy layer.

14. A power management circuit comprising:
    a semiconductor device comprising:
        a first transistor coupled to a voltage input/output terminal and comprising an N-type buffer layer and a first N-type heavily doped layer, the first N-type heavily doped layer being formed in the N-type buffer layer; and
        a second transistor coupled to a ground terminal and integrated with the first transistor, the second transistor comprising the N-type buffer layer and the first N-type heavily doped layer.

15. The power management circuit as claimed in claim 14, wherein the second transistor further comprises an N-type drift diffusion layer, the second transistor has a bipolar junction transistor (BJT) equivalent circuit, and the N-type drift diffusion layer is provided as a collector of the BJT equivalent circuit.

16. The power management circuit as claimed in claim 15, wherein the second transistor further comprises a second N-type heavily doped layer, and the second N-type heavily doped layer is coupled to the ground terminal and provided as an emitter of the BJT equivalent circuit in the second transistor.

17. The power management circuit as claimed in claim 14, wherein the second transistor further comprises:
- a second N-type heavily doped layer; and
- a P-type heavily doped layer coupled adjacently between the first N-type heavily doped layer and the second N-type heavily doped layer and provided as an anode of a silicon controlled rectifier (SCR) equivalent circuit in the second transistor.

18. The power management circuit as claimed in claim 17, wherein the second transistor further comprises a third N-type heavily doped layer provided as a cathode of the SCR equivalent circuit in the second transistor.

19. The power management circuit as claimed in claim 14, wherein the first transistor and the second transistor share a P-type doped layer, and the N-type buffer layer is formed in the P-type doped layer.

* * * * *

UNITED STATES PATENT AND TRADEMARK OFFICE
CERTIFICATE OF CORRECTION

PATENT NO. : 8,611,059 B2
APPLICATION NO. : 13/410280
DATED : December 17, 2013
INVENTOR(S) : Che-Hung Chen and Yu-Ti Su It is certified that error appears in the above-identified patent and that said Letters Patent is hereby corrected as shown below:

The Title Page should be replaced with the attached Title Page.

In the Drawings:

Replace Sheets 1-10 with the attached drawings.

Signed and Sealed this
Fifteenth Day of July, 2014

Michelle K. Lee
*Deputy Director of the United States Patent and Trademark Office*

(12) United States Patent
Chen et al.

(10) Patent No.: US 8,611,059 B2
(45) Date of Patent: Dec. 17, 2013

(54) POWER MANAGEMENT CIRCUIT AND HIGH VOLTAGE DEVICE THEREIN

(75) Inventors: Che-Hung Chen, Taipei (TW); Yu-Ti Su, Tainan (TW)

(73) Assignee: Nuvoton Technology Corporation, Hsinchu (TW)

(*) Notice: Subject to any disclaimer, the term of this patent is extended or adjusted under 35 U.S.C. 154(b) by 0 days.

(21) Appl. No.: 13/410,280

(22) Filed: Mar. 1, 2012

(65) Prior Publication Data

US 2012/0275072 A1 Nov. 1, 2012

(30) Foreign Application Priority Data

Apr. 27, 2011 (TW) .............................. 100114704 A

(51) Int. Cl.
| | |
|---|---|
| *H02H 9/00* | (2006.01) |
| *H02H 7/12* | (2006.01) |
| *H02H 1/00* | (2006.01) |
| *H02H 1/04* | (2006.01) |
| *H02H 3/22* | (2006.01) |

(52) U.S. Cl.
USPC ............................................ 361/56; 361/118

(58) Field of Classification Search
USPC .................................................... 361/56, 118
See application file for complete search history.

(56) References Cited

U.S. PATENT DOCUMENTS

| | | |
|---|---|---|
| 6,358,781 B1 | 3/2002 | Lee et al. |
| 6,542,346 B1 | 4/2003 | Chen et al. |
| 6,724,592 B1 * | 4/2004 | Tong et al. ............. 361/56 |
| 7,978,450 B1 * | 7/2011 | Perisetty ................ 361/56 |
| 2008/0013231 A1 | 1/2008 | Bazzano et al. |
| 2008/0128818 A1 | 6/2008 | Chen et al. |
| 2011/0051298 A1 * | 3/2011 | Lai ......................... 361/56 |

OTHER PUBLICATIONS

Kwang-Hoon Oh, "Investigation of ESD performance in advanced CMOS technology" PhD thesis, University of Stanford, 2002.
Physics and operation of ESD Protection Circuit Elements.

* cited by examiner

*Primary Examiner* — Dharti Patel
(74) *Attorney, Agent, or Firm* — CKC & Partners Co., Ltd.

(57) ABSTRACT

A high voltage device includes a high voltage transistor and a protection device. The high voltage transistor has a first end and a second end, in which the first end is coupled to a voltage input/output terminal. The protection device is coupled between the second end of the high voltage transistor and a ground terminal, and has a parasitical equivalent circuit. When the voltage input/output terminal is charged based on positive ESD charges, the current corresponding to the positive ESD charges flows from the voltage input/output terminal through the high voltage transistor and the equivalent circuit in the protection device toward the ground terminal. A power management circuit is also disclosed herein.

19 Claims, 10 Drawing Sheets

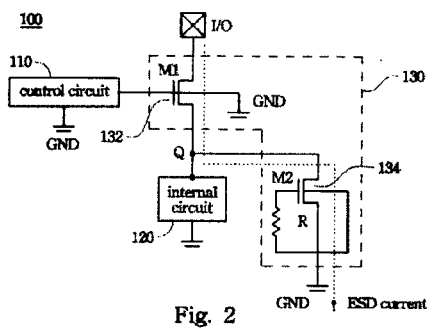

Fig. 2